US010150863B2

(12) United States Patent
Wu et al.

(10) Patent No.: US 10,150,863 B2
(45) Date of Patent: Dec. 11, 2018

(54) PLATING PERFORMANCE USING COMBINATION METAL OXIDE AND METAL POWDER AS ADDITIVES

(71) Applicant: SABIC Global Technologies B.V., Bergen op Zoom (NL)

(72) Inventors: Tong Wu, Shanghai (CN); Yangang Yan, Shanghai (CN); Yuxian An, Shanghai (CN); Yegang Lin, Shanghai (CN); Xueming Lian, Shanghai (CN)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 0 days.

(21) Appl. No.: 14/914,839

(22) PCT Filed: Sep. 4, 2014

(86) PCT No.: PCT/IB2014/064264

§ 371 (c)(1),
(2) Date: Feb. 26, 2016

(87) PCT Pub. No.: WO2015/033295

PCT Pub. Date: Mar. 12, 2015

(65) Prior Publication Data

US 2016/0230003 A1 Aug. 11, 2016

Related U.S. Application Data

(60) Provisional application No. 61/874,707, filed on Sep. 6, 2013.

(51) Int. Cl.

| | |
|---|---|
| ***C08G 18/67*** | (2006.01) |
| ***C08L 51/00*** | (2006.01) |
| ***C08L 69/00*** | (2006.01) |
| ***B05D 3/00*** | (2006.01) |
| ***C08J 7/18*** | (2006.01) |
| ***G21H 5/00*** | (2006.01) |
| ***C08L 83/00*** | (2006.01) |
| ***D06P 1/52*** | (2006.01) |
| ***C23C 18/16*** | (2006.01) |
| ***C23C 18/28*** | (2006.01) |
| ***C23C 18/38*** | (2006.01) |
| *H05K 3/18* | (2006.01) |

(52) U.S. Cl.

CPC .......... *C08L 69/00* (2013.01); *C23C 18/1641* (2013.01); *C23C 18/28* (2013.01); *C23C 18/38* (2013.01); *C08L 2201/08* (2013.01); *C08L 2205/025* (2013.01); *C08L 2205/03* (2013.01); *C08L 2205/06* (2013.01); *H05K 3/185* (2013.01); *H05K 2203/072* (2013.01); *H05K 2203/107* (2013.01)

(58) Field of Classification Search

None

See application file for complete search history.

(56) References Cited

U.S. PATENT DOCUMENTS

| | | | | |
|---|---|---|---|---|
| 7,786,246 B2 | 8/2010 | Jansen et al. | | |
| 2008/0081884 A1* | 4/2008 | Glasgow | C08L 83/10 | 525/464 |
| 2009/0292048 A1* | 11/2009 | Li | C08L 55/02 | 524/115 |
| 2012/0329922 A1* | 12/2012 | Schrauwen | H05K 3/185 | 524/165 |

FOREIGN PATENT DOCUMENTS

| | | |
|---|---|---|
| EP | 2335936 A1 | 6/2011 |
| EP | 2604648 A1 | 6/2013 |
| WO | 2012056385 A1 | 5/2012 |
| WO | 2012056416 A1 | 5/2012 |

OTHER PUBLICATIONS

International Search Report dated Dec. 15, 2014; International Application No. PCT/IB2014/064264; International Filing Date Sep. 4, 2014 (4 pages).

Written Opinion dated Dec. 15, 2014; International Application No. PCT/IB2014/064264; International Filing Date Sep. 4, 2014 (5 pages).

* cited by examiner

*Primary Examiner* — Robert T Butcher

(74) *Attorney, Agent, or Firm* — Cantor Colburn LLP

(57) ABSTRACT

The present disclosure relates to blended thermoplastic compositions comprising: a) from about 20 wt % to about 80 wt % of a polycarbonate polymer component; b) from about 5 wt % to about 30 wt % of a polycarbonate-polysiloxane copolymer component; c) from about 1 wt % to about 20 wt % of a laser direct structuring additive component; and d) from about 0.02 wt % to about 5 wt % of a metal component; wherein the combined weight percent value of all components does not exceed about 100 wt %; and wherein all weight percent values are based on the total weight of the composition.

18 Claims, 1 Drawing Sheet

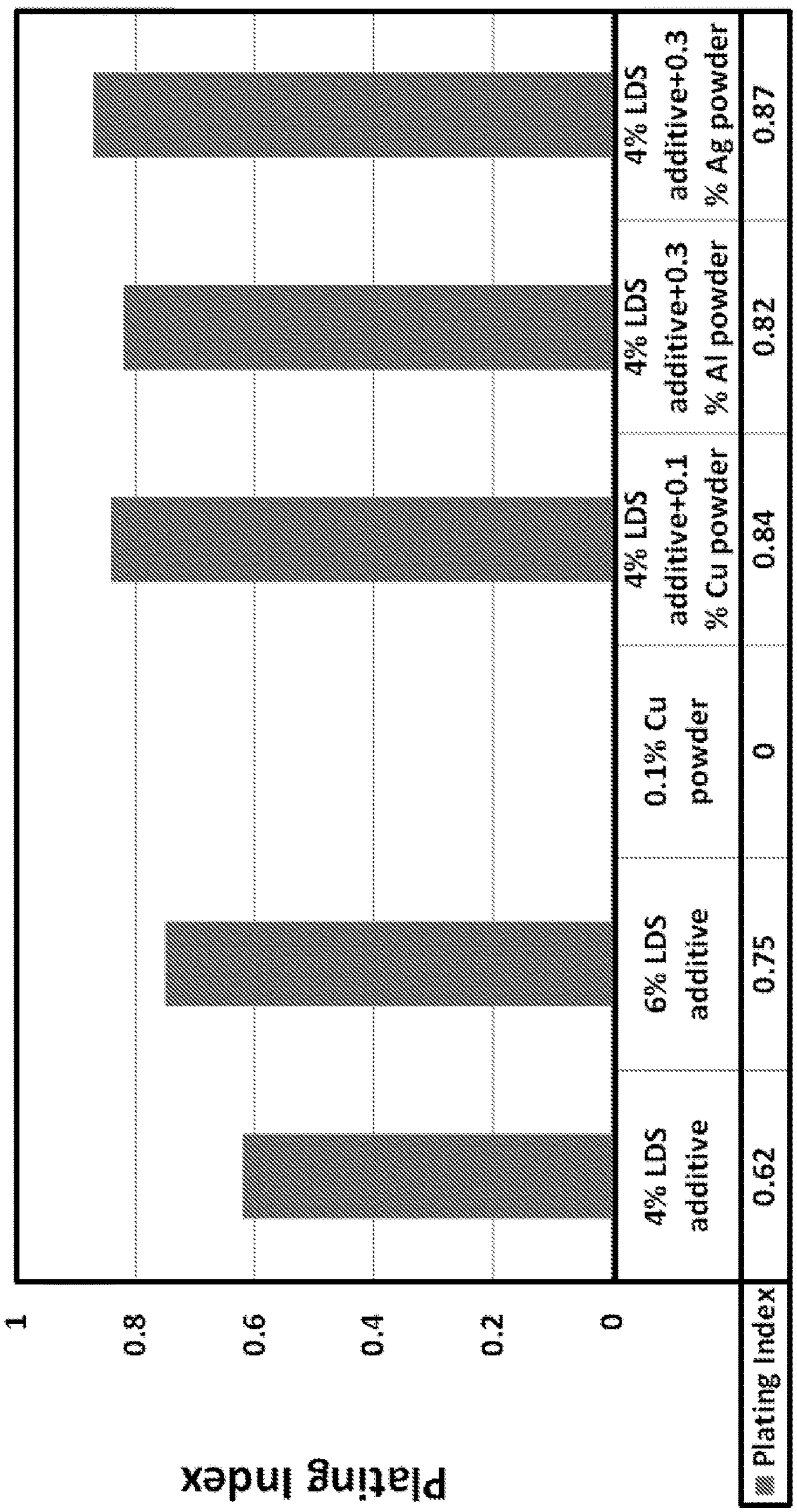
Comparison of Plating Index
Plating Index
1
0.8
0.6
0.4
0.2
0
4% LDS additive
6% LDS additive
0.1% Cu powder
4% LDS additive+0.1 % Cu powder
4% LDS additive+0.3 % Al powder
4% LDS additive+0.3 % Ag powder
Plating Index
0.62
0.75
0
0.84
0.82
0.87

PLATING PERFORMANCE USING COMBINATION METAL OXIDE AND METAL POWDER AS ADDITIVES

CROSS-REFERENCE TO RELATED APPLICATIONS

This application is a National Stage application of PCT/IB2014/064264, filed Sep. 4, 2014, which claims the benefit of U.S. Provisional Application No. 61/874,707, filed Sep. 6, 2013, both of which are incorporated by reference herein in their entirety.

TECHNICAL FIELD

The present disclosure relates to blended thermoplastic compositions comprising one or more polycarbonate polymers, one or more polycarbonate-polysiloxane copolymers, one or more laser direct structuring additives, and one or more metal components, wherein the blended polymer compositions have improved plating performance.

BACKGROUND

Electrical components can be provided as molded injection devices ("MID") with desired printed conductors. In contrast to conventional circuit boards made of fiberglass-reinforced plastic or the like, MID components manufactured in this way are three-dimensional (3D) molded parts having an integrated printed conductor layout and possibly further electronic or electromechanical components. The use of MID components of this type, even if the components have only printed conductors and are used to replace conventional wiring inside an electrical or electronic device, saves space, allowing the relevant device to be made smaller. It also lowers the manufacturing costs by reducing the number of assembly and contacting steps. These MID devices have great utility in cell phones, PDAs and notebook applications.

Traditional methods of manufacture are tool-based technologies, which have limited flexibility, long development cycles, difficult prototype, expensive design changes, and limited ability to produce miniaturization. Accordingly, it is becoming increasingly popular to form MIDs using a laser direct structuring ("LDS") process. In an LDS process a computer-controlled laser beam travels over the MID to activate the plastic surface at locations where the conductive path is to be situated.

In a conventional LDS process, a thermoplastic composition can be doped with a metal containing LDS additive such that it can be activated by a laser. The laser beam can then be used to activate the LDS additive forming a micro-rough track on the surface. The metal particles from the LDS additive present on the surface of the micro-rough track can in turn form nuclei for the subsequent metallization. However, due to different chemical plating solutions and conditions used, the plating performance of conventional LDS materials can vary in ways such as plating rate and adhesion of plating layers. In addition, some LDS fillers have a surface pH that may be detrimental to the polymer matrix during processing, resulting in degradation of the polymers. This polymer matrix degradation leads to, for example, decreased ductility for the final composition. The changed ductility, along with and other property changes, may result in substantial, and potentially undesirable, changes in the material's overall properties.

Accordingly, it would be beneficial to provide a LDS blended thermoplastic composition (or LDS compound) having good plating performance while maintaining good mechanical performance. It would also be beneficial to provide a thermoplastic composition that is capable of being used in a laser direct structuring process. Accordingly, there remains a need for thermoplastic compositions that prevent or reduce polymer matrix degradation during processing. This and other needs are satisfied by the various embodiments of the present disclosure.

SUMMARY

The present disclosure relates to thermoplastic polymer compositions comprising one or more polycarbonate polymers, one or more polycarbonate-polysiloxane copolymers, one or more laser direct structuring additives, and one or more metal components, wherein the blended polymer compositions have improved plating performance. The disclosed blended thermoplastic compositions are capable of being used in a laser direct structuring (LDS) process and provide enhanced plating performance while exhibiting good mechanical properties. The present disclosure also relates to methods of manufacturing these compositions and articles that include these compositions. The present disclosure, in certain embodiments, relates to method for improving plating performance.

In one embodiment, the present disclosure relates to blended thermoplastic compositions comprising: a) from about 20 weight percent (wt %) to about 80 wt % of a polycarbonate polymer component; b) from about 5 wt % to about 30 wt % of a polycarbonate-polysiloxane copolymer component; c) from about 1 wt % to about 20 wt % of a laser direct structuring additive component; and d) from about 0.02 wt % to about 5 wt % of a metal component; wherein the combined weight percent value of all components does not exceed about 100 wt %; and wherein all weight percent values are based on the total weight of the composition.

In various further embodiments, the disclosure relates to articles comprising the disclosed compositions.

While embodiments of the present disclosure can be described and claimed in a particular statutory class, such as the system statutory class, this is for convenience only and one of skill in the art will understand that each embodiment of the present disclosure can be described and claimed in any statutory class.

BRIEF DESCRIPTION OF THE DRAWINGS

The accompanying figures, which are incorporated in and constitute a part of this specification, illustrate several embodiments and together with the description serve to explain certain embodiments of the disclosure.

FIG. 1 shows representative data obtained with representative disclosed formulations pertaining to the synergistic effect in the plating performance observed with a combination of LDS additive and metal filler.

DETAILED DESCRIPTION

The present disclosure can be understood more readily by reference to the following detailed description and the Examples included therein. In various embodiments, the present disclosure pertains to blended thermoplastic compositions comprising polycarbonate, polycarbonate-polysiloxane copolymer, laser direct structuring additive, and metal, wherein a molded sample of the blended thermoplastic composition exhibits a plating index value from about 0.7 to about 2.0. In a further embodiment, a molded sample of the blended thermoplastic composition exhibits a plating index value from about 0.7 to about 1.5. In a still further embodiment, a molded sample of the blended thermoplastic composition exhibits a plating index value from about 0.7 to about 1.2.

In various embodiments, the present disclosure pertains to blended thermoplastic compositions, wherein a molded sample of the blended thermoplastic composition has a Notched Izod impact strength ("NII") from about 50 Joules per meter (J/m) to about 800 J/m. In a further embodiment, a molded sample of the blended thermoplastic composition has a NII from about 70 J/m to about 750 J/m. In a still further embodiment, a molded sample of the blended thermoplastic composition has a NII from about 100 J/m to about 700 J/m.

It is to be understood that unless otherwise expressly stated, it is not intended that methods set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is not intended that an order be inferred The terms "polycarbonate" or "polycarbonates" as used herein includes copolycarbonates, homopolycarbonates and (co)polyester carbonates.

The term polycarbonate can be further defined as compositions have repeating structural units of the formula (1):

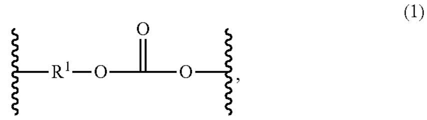

(1)

in which at least 60 percent of the total number of $R^1$ groups are aromatic organic radicals and the balance thereof are aliphatic, alicyclic, or aromatic radicals. In a further embodiment, each $R^1$ is an aromatic organic radical and, more preferably, a radical of the formula (2):

$$-A^1-Y^1-A^2- \quad (2),$$

wherein each of $A^1$ and $A^2$ is a monocyclic divalent aryl radical and $Y^1$ is a bridging radical having one or two atoms that separate $A^1$ from $A^2$. In various embodiments, one atom separates $A^1$ from $A^2$. For example, radicals of this type include, but are not limited to, radicals such as —O—, —S—, —S(O)—, —$S(O_2)$—, —C(O)—, methylene, cyclohexyl-methylene, 2-[2.2.1]-bicycloheptylidene, ethylidene, isopropylidene, neopentylidene, cyclohexylidene, cyclopentadecylidene, cyclododecylidene, and adamantylidene. The bridging radical $Y^1$ is preferably a hydrocarbon group or a saturated hydrocarbon group such as methylene, cyclohexylidene, or isopropylidene. Polycarbonate materials include materials disclosed and described in U.S. Pat. No. 7,786,246, which is hereby incorporated by reference in its entirety for the specific purpose of disclosing various polycarbonate compositions and methods for manufacture of same. Polycarbonate polymers can be manufactured by means known to those skilled in the art.

Some compositions comprise two or more polycarbonate polymers. In some embodiments, the blended thermoplastic polymer comprises from about 20 wt % to about 40 wt % of a first polycarbonate component. In some embodiments, the first polycarbonate polymer has a melt flow rate ("MFR") from about 20 grams/10 minutes (g/10 min) to about 30 grams/10 minutes when measured at 300 degrees Celsius (° C.) and under a load of 1.2 kilograms (kg) according to ASTM D1238. In certain embodiments, the first polycarbonate polymer has a weight average molecular weight from about 18,000 to about 25,000 grams/mole (g/mol), as measured by gel permeation chromatography using bisphenol A ("BPA") polycarbonate standards.

For certain compositions having two or more polycarbonate polymers, the second polycarbonate polymer is present in an amount of from about 20 wt % to about 40 wt % of a second polycarbonate component. Some preferred second polycarbonate polymers have a melt flow rate (MFR) from about 4.0 grams/10 minutes to about 10.0 grams/10 minutes when measured at 300° C. and under a load of 1.2 kg according to ASTM D1238. Some second polycarbonate polymer components have a weight average molecular weight from about 25,000 to about 30,000 grams/mole, as measured by gel permeation chromatography using BPA polycarbonate standards.

Compositions also contain a polycarbonate-polysiloxane copolymer. In some embodiments, the polycarbonate-polysiloxane copolymer is present in an amount of 5 wt % to about 30 wt % of the blended thermoplastic composition.

As used herein, the term "polycarbonate-polysiloxane copolymer" is equivalent to polysiloxane-polycarbonate copolymer, polycarbonate-polysiloxane polymer, or polysiloxane-polycarbonate polymer. In various embodiments, the polycarbonate-polysiloxane copolymer can be a block copolymer comprising one or more polycarbonate blocks and one or more polysiloxane blocks. In certain embodiments, the polycarbonate block can be as described above. The polysiloxane-polycarbonate copolymer comprises polydiorganosiloxane blocks comprising structural units of the general formula (13) below:

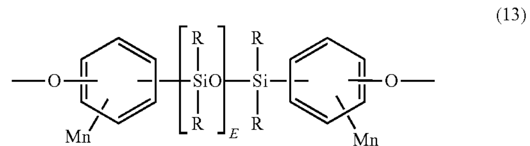

(13)

wherein the polydiorganosiloxane block length (E) is from about 20 to about 60; wherein each R group can be the same or different, and is selected from a $C_{1-13}$ monovalent organic group; wherein each M can be the same or different, and is selected from a halogen, cyano, nitro, $C_1$-$C_8$ alkylthio, $C_1$-$C_8$ alkyl, $C_1$-$C_8$ alkoxy, $C_2$-$C_8$ alkenyl, $C_2$-$C_8$ alkenyloxy group, $C_3$-$C_8$ cycloalkyl, $C_3$-$C_8$ cycloalkoxy, $C_6$-$C_{10}$ aryl, $C_6$-$C_{10}$ aryloxy, $C_7$-$C_{12}$ aralkyl, $C_7$-$C_{12}$ aralkoxy, $C_7$-$C_{12}$ alkylaryl, or $C_7$-$C_{12}$ alkylaryloxy, and where each n is independently 0, 1, 2, 3, or 4. The polysiloxane-polycarbonate copolymer also comprises polycarbonate blocks comprising structural units of the general formula (14) below:

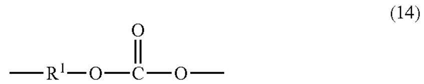

(14)

wherein at least 60 percent of the total number of $R^1$ groups comprise aromatic moieties and the balance thereof comprise aliphatic, alicyclic, or aromatic moieties. Polysiloxanepolycarbonates materials include materials disclosed and described in U.S. Pat. No. 7,786,246, which is hereby incorporated by reference in its entirety for the specific purpose of disclosing various compositions and methods for manufacture of same.

In addition to the thermoplastic resin, the compositions of the present disclosure also include a laser direct structuring (LDS) additive. The LDS additive is selected to enable the composition to be used in a laser direct structuring process. In an LDS process, a laser beam exposes the LDS additive to place it at the surface of the thermoplastic composition and to activate metal atoms from the LDS additive. As such, the LDS additive is selected such that, upon exposed to a laser beam, metal atoms are activated and exposed and in areas not exposed by the laser beam, no metal atoms are exposed. In addition, the LDS additive is selected such that, after being exposed to laser beam, the etching area is capable of being plated to form conductive structure. As used herein "capable of being plated" refers to a material wherein a substantially uniform metal plating layer can be plated on laser-etched area and show a wide window for laser parameters. This process is different than laser marking wherein the main outcome of laser marking is a color change in the material under the effect of energy radiation. And the key characterization for laser marking is the contrast between the mark and the substrate.

Conversely, for LDS, the goal is the formation of metal seeds on the laser etched surface, and the final metallization layer during the following plating process. Plating rate and adhesion of plated layers are the key evaluation requirements. Color here means the substrate made from these materials itself not the color change under the laser radiation. As such, in addition to enabling the composition to be used in a laser direct structuring process, the LDS additive used in the present disclosure is also selected to help enable the composition to be colored while maintaining physical properties.

According to various embodiments of the present disclosure, the laser direct structuring additive can comprise one or more metal oxides, including for example, oxides of copper, titanium, tin, zinc, magnesium, aluminum, gold, and silver, or combinations thereof. These laser direct structuring additives can also be provided having spinel type crystal structures. An exemplary and non-limiting example of a commercially available laser direct structuring additive includes PK3095 black pigment, commercially available from Ferro Corp., USA. PK3095, for example, comprises chromium oxides ($Cr_2O_3$, $Cr_2O_4^{2-}$, $Cr_2O_7^{2-}$) and oxides of copper (CuO), as determined using x-ray photoelectron spectroscopy ("XPS"). The PK3095 black pigment also has a spinel type crystal structure. Another exemplary commercially available laser direct structuring additive is the Black 1G pigment black 28 commercially available from The Shepherd Color company. The Black 1G pigment black 28 comprises copper chromate and has a pH of about 7.3. The Black 1G pigment also has a spinel type crystal structure.

Current additives for LDS materials are usually spinel based metal oxides (such as copper chromium oxide), organic metal complexes (such as palladium/palladium-containing heavy metal complexes) or copper complexes there are some limitations based on these additives. However, spinel based metal oxides result in a black color. In addition, with organic metal complex, higher loadings are needed to obtain sufficiently dense nucleation for rapid metallization when activated, and these higher amounts adversely affect the mechanical properties of the materials.

LDS additives that enable coloring of the material while retaining mechanical strength of the composition can also be used in the present disclosure. Examples of useful LDS additives include, but are not limited to, a metal oxide-coated filler. In one embodiment, the LDS additive is antimony doped tin oxide coating on a mica substrate. Other examples include a coating including a copper containing metal oxide, a titanium containing metal oxide, a tin containing metal oxide, a zinc containing metal oxide, a magnesium containing metal oxide, an aluminum containing metal oxide, a gold containing metal oxide, a silver containing metal oxide, or a combination including at least one of the foregoing metal oxides, and the substrate can be any other mineral, such as silica.

Examples of laser direct structuring additives include, but are not limited to, a metal oxide, a metal-oxide coated filler, and a heavy metal mixture oxide spinel, such as copper chromium oxide spinel; a copper salt, such as copper hydroxide phosphate copper phosphate, copper sulfate, cuprous thiocyanato; organic metal complexes, such as palladium/palladium-containing heavy metal complexes or copper complexes; or a combination including at least one of the foregoing LDS additives. In a further embodiment, the laser direct structure additive is a metal oxide selected from a copper-containing metal oxide, a titanium-containing metal oxide, a tin-containing metal oxide, a zinc-containing metal oxide, a magnesium-containing metal oxide, an aluminum-containing metal oxide, a gold-containing metal oxide, and a silver-containing metal oxide, or a combination thereof.

Further non-limiting examples of suitable metal oxide materials that can be used as a laser direct structuring additive include antimony doped tin oxide coating on a mineral substrate, a copper containing metal oxide coating on a mineral substrate, a zinc containing metal oxide coating on a mineral substrate, a tin containing metal oxide coating on a mineral substrate, a magnesium containing metal oxide coating on a mineral substrate, an aluminum containing metal oxide coating on a mineral substrate, a gold containing metal oxide coating on a mineral substrate, a silver containing metal oxide coating on a mineral substrate, or a combination thereof. The mineral substrate can be a variety of mineral materials including silica and mica.

In various embodiments, the laser direct structuring (LDS) additive is selected from a heavy metal mixture oxide spinel, a copper salt, or a combination including at least one of the foregoing laser direct structuring additives. In a further embodiment, the laser direct structuring (LDS) additive comprises a combination of copper chromium oxide and at least one additional additive selected from a heavy metal mixture oxide spinel, or a copper salt.

In a further embodiment, the laser direct structure additive is a copper-containing material. In a still further embodiment, the copper-containing material is copper hydroxide phosphate. In a yet further embodiment, the laser direct structuring (LDS) additive comprises copper chromium oxide. In a still further embodiment, the laser direct structuring (LDS) additive consists essentially of copper chromium oxide. In a still further embodiment, the laser direct structuring (LDS) additive consists essentially of copper hydroxide phosphate.

In a further embodiment, the LDS is a metal-oxide coated filler is antimony doped tin oxide coating on a mica substrate, a copper-containing metal oxide, a zinc-containing metal oxide, a tin-containing metal oxide, a magnesium-containing metal oxide, an aluminum-containing metal oxide, a gold-containing metal oxide, and a silver-containing metal oxide, or a combination including at least one of the foregoing metal oxides, and the substrate may be any other mineral, such as silica.

The amount of the LDS additive included is sufficient to enable plating of the track formed after activation by the laser while not adversely affecting mechanical properties.

In a further embodiment, the laser direct structure additive is present in an amount from about 0.5 wt % to about 20 wt %. In a still further embodiment, the laser direct structure additive is present in an amount from about 0.5 wt % to about 17.5 wt %. In yet a further embodiment, the laser direct structure additive is present in an amount from about 0.5 wt % to about 15 wt %. In an even further embodiment, the laser direct structure additive is present in an amount from about 0.5 wt % to about 12.5 wt %. In a still further embodiment, the laser direct structure additive is present in an amount from about 1 wt % to about 20 wt %. In yet a further embodiment, the laser direct structure additive is present in an amount from about 1 wt % to about 17.5 wt %. In an even further embodiment, the laser direct structure additive is present in an amount from about 1 wt % to about 15 wt %. In a still further embodiment, the laser direct structure additive is present in an amount from about 1 wt % to about 12.5 wt %.

As discussed, the LDS additive is selected such that, after activating with a laser, the conductive path can be formed by followed a standard electroless plating process. When the LDS additive is exposed to the laser, elemental metal is released. The laser draws the circuit pattern onto the part and leaves behind a roughened surface containing embedded metal particles. These particles act as nuclei for the crystal growth during a subsequent plating process, such as a copper plating process. Other electroless plating processes that can be used include, but are not limited to, gold plating, nickel plating, silver plating, zinc plating, tin plating or the like.

In various embodiments, the blended thermoplastic compositions of the present disclosure comprise one or more metal fillers. These may be metals that do not melt under the conditions used in incorporating them into the thermoplastic polymers, and fabricating finished articles there from. Metals such as aluminum, copper, zinc, platinum, lead, chromium, tin, nickel, gold, silver, iron, titanium, or the like, or a combination including at least one of the foregoing metals may be incorporated. The solid metal fillers may exist in the form of powder, drawn wires, strands, fibers, tubes, nanotubes, flakes, laminates, platelets, ellipsoids, discs, and other commercially available geometries.

Exemplary metal fillers are those having average particle sizes of less than 200 nanometers (nm). In one embodiment, metal fillers having particle sizes of less than about 180 nm are used. In a further embodiment, metal fillers having particle sizes of less than about 160 nm are used. In a further embodiment, metal fillers having particle sizes of less than about 140 nm are used. In a still further embodiment, metal fillers having particle sizes of from about 200 nm to about 5 micrometers (μm) are used.

In various embodiments, the metal filler is silver coated copper. In further embodiments, the silver is present in an amount from about 1 wt % to about 20 wt % or in an amount from about 1 wt % to about 15 wt % or in an amount from about 1 wt % to about 10 wt % or in an amount from about 2.5 wt % to about 20 wt % or in an amount from about 5 wt % to about 20 wt % or in an amount from about 5 wt % to about 15 wt % or in an amount from about 5 wt % to about 10 wt %.

In a further embodiment, the metal filler component is present in an amount from about 0.02 wt % to about 5.0 wt %. In a still further embodiment, the metal filler component is present in an amount from about 0.02 wt % to about 4.0 wt %. In yet a further embodiment, the metal filler component is present in an amount from about 0.02 wt % to about 3.0 wt %. In an even further embodiment, the metal filler component is present in an amount from about 0.02 wt % to about 2.0 wt %. In a still further embodiment, the metal filler component is present in an amount from about 0.02 wt % to about 1.0 wt %.

In various embodiments, the blended thermoplastic compositions of the present disclosure comprise one or more fillers. In a further embodiment, the blended thermoplastic compositions comprise one or more mineral fillers. In some embodiments, the mineral filler is an inorganic filler. Exemplary inorganic fillers include talc, mica, clay, wollastonite, glass fiber, and the like. Combinations of fillers can also be used. In a further embodiment, the inorganic filler is talc.

The disclosed polymer compositions can optionally comprise one or more additives conventionally used in the manufacture of molded thermoplastic parts with the proviso that the optional additives do not adversely affect the desired properties of the resulting composition. Mixtures of optional additives can also be used. Such additives can be mixed at a suitable time during the mixing of the components for forming the composite mixture. For example, the disclosed compositions can comprise one or more lubricants, plasticizers, ultraviolet light absorbing additives, anti-dripping agents, dyes, pigments, stabilizers, anti-static agents, flame-retardants, impact modifiers, colorants, antioxidant, metal deactivators, chain extenders, and/or mold release agents. In one embodiment, the composition further comprises one or more optional additives selected from an antioxidant, mold release agent, metal deactivator, chain extender, and stabilizer.

Shaped, formed, or molded articles including the polymer compositions are also provided. The polymer compositions can be molded into useful shaped articles by a variety of means such as injection molding, extrusion, rotational molding, blow molding and thermoforming to form articles such as, for example, personal computers, notebook and portable computers, cell phone antennas and other such communications equipment, medical applications, radio frequency identification ("RFID") applications, automotive applications, and the like. Techniques for such manufacture are known to those skilled in the art. In some embodiments, the molded article further comprises a conductive path formed by activation with a laser. In various embodiments, the polymer composition can be used in the field of electronics. In a further embodiment, non-limiting examples of fields which can use the disclosed blended polymer compositions include electrical, electro-mechanical, Radio Frequency ("RF") technology, telecommunication, automotive, aviation, medical, sensor, military, and security. In a still further embodiment, the use of the disclosed blended polymer compositions can also be present in overlapping fields, for example in mechatronic systems that integrate mechanical and electrical properties which may, for example, be used in automotive or medical engineering.

In one embodiment, molded articles according to the present disclosure can be used to produce a device in one or more of the foregoing fields. In a still further embodiment, non-limiting examples of such devices in these fields which can use the disclosed blended polymer compositions according to the present disclosure include computer devices, household appliances, decoration devices, electromagnetic interference devices, printed circuits, Wi-Fi devices, Bluetooth devices, global positioning system ("GPS") devices, cellular antenna devices, smart phone devices, automotive devices, military devices, aerospace devices, medical devices, such as hearing aids, sensor devices, security devices, shielding devices, RF antenna devices, light emitting diode ("LED") devices, or RFID devices. In yet a further embodiment, the device is selected from a computer device, electromagnetic interference device, automotive device, medical device, sensor device, security device, shielding device, RF antenna device, LED device (such as a LED lamp) and RFID device. In an even further embodiment, the device is selected from a computer device, sensor device, security device, RF antenna device, LED device and RFID device. In a still further embodiment, the device is selected from a computer device, LED device and RFID device.

In a still further embodiment, the molded articles can be used to manufacture devices in the automotive field. In a further embodiment, non-limiting examples of such devices in the automotive field which can use the disclosed blended polymer compositions in the vehicle's interior include adaptive cruise control, headlight sensors, windshield wiper sensors, and door/window switches. In a further embodiment, non-limiting examples of devices in the automotive field which can use the disclosed blended polymer compositions in the vehicle's exterior include pressure and flow sensors for engine management, air conditioning, crash detection, and exterior lighting fixtures.

In a further embodiment, the resulting disclosed compositions can be used to provide any desired shaped, formed, or molded articles. For example, the disclosed compositions can be molded into useful shaped articles by a variety of means such as injection molding, extrusion, rotational molding, blow molding and thermoforming. As noted above, the disclosed compositions are particularly well suited for use in the manufacture of electronic components and devices. As such, according to some embodiments, the disclosed compositions can be used to form articles such as printed circuit board carriers, burn in test sockets, flex brackets for hard disk drives, and the like.

In various embodiments, a molded article comprising the disclosed blended thermoplastic compositions can have a melt volume rate ("MVR") from about 10 cubic centimeters per 10 minutes ($cm^3$/10 min) to about 25 $cm^3$/10 min, or from about 12 to about 22 $cm^3$/10 min, or from about 12 to about 20 $cm^3$/10 min, when determined in accordance with ASTM D1238 under a load of 1.2 kg and at a temperature of 300° C. at 360 seconds (s).

In various embodiments, a molded article comprising the disclosed blended thermoplastic compositions can have a tensile stress at break from about 40 megapascal (MPa) to about 200 MPa, or from about 40 to about 150 MPa, or from about 50 to about 100 MPa, when determined in accordance with ASTM D638 at a speed of 50 millimeters per minute (mm/min).

In various embodiments, a molded article comprising the disclosed blended thermoplastic compositions can have a tensile stress at yield from about 45 MPa to about 200 MPa, or from about 45 to about 150 MPa, or from about 55 to about 100 MPa, when determined in accordance with ASTM D638 at a speed of 50 mm/min.

In various embodiments, a molded article comprising the disclosed blended thermoplastic compositions can have a tensile elongation at yield from about 2 percent (%) to about 150%, or from about 2 to about 100%, or from about 2 to about 80%, when determined in accordance with ASTM D638 at a speed of 50 mm/min.

In various embodiments, a molded article comprising the disclosed blended thermoplastic compositions can have a flexural modulus from about 2,000 MPa to about 10,000 MPa, or from about 2300 to about 9000 MPa, or from about 2400 to about 8000 MPa, when determined in accordance with ASTM D790 at a speed of 1.27 mm/min.

In various embodiments, a molded article comprising the disclosed blended thermoplastic compositions can have a flexural stress at yield from about 40 MPa to about 200 MPa, or from about 50 to about 180 MPa, or from about 80 to about 140 MPa, when determined in accordance with ASTM D790 at a speed of 1.27 mm/min.

In various embodiments, a molded article comprising the disclosed blended thermoplastic compositions can have a notched Izod impact strength from about 100 J/m to about 700 J/m, or from about 50 J/m to about 800 J/m, or from about 70 to about 750 J/m, when determined in accordance with ASTM D256.

In various embodiments, a molded article comprising the disclosed blended thermoplastic compositions can have a heat deflection temperature from about 100° C. to about 200° C., or from about 100 to about 180° C., or from about 110 to about 150° C., when determined in accordance with ASTM D648.

In various embodiments, a molded article comprising the disclosed blended thermoplastic compositions can have a plating index from about 0.7 to about 2.0, or from about 0.7 to about 1.5, or from about 0.7 to about 1.2, when determined in accordance with ASTM B568.

In one embodiment, the disclosure pertains to methods of improving plating performance of a blended thermoplastic composition by utilizing blended thermoplastic compositions disclosed herein.

The compositions of the present disclosure can be blended with the aforementioned ingredients by a variety of methods involving intimate admixing of the materials with any additional additives desired in the formulation. Because of the availability of melt blending equipment in commercial polymer processing facilities, melt processing methods are generally preferred. Illustrative examples of equipment used in such melt processing methods include: co-rotating and counter-rotating extruders, single screw extruders, co-kneaders, disc-pack processors and various other types of extrusion equipment. The temperature of the melt in the present process is preferably minimized in order to avoid excessive degradation of the resins. It is often desirable to maintain the melt temperature between about 230° C. and about 350° C. in the molten resin composition, although higher temperatures can be used provided that the residence time of the resin in the processing equipment is kept short. In some embodiments the melt processed composition exits processing equipment such as an extruder through small exit holes in a die. The resulting strands of molten resin are cooled by passing the strands through a water bath. The cooled strands can be chopped into small pellets for packaging and further handling. Various manufacturing processes are known to those skilled in the art.

Compositions can be manufactured by various methods. For example, polymer, and/or other optional components are first blended, optionally with fillers in mixer. The blend is then fed into the throat of a twin-screw extruder via a hopper. Alternatively, at least one of the components can be incorporated into the composition by feeding directly into the extruder at the throat and/or downstream through a side-stuffer. Additives can also be compounded into a masterbatch with a desired polymeric resin and fed into the extruder. The extrudate is immediately quenched in a water batch and pelletized. The pellets, so prepared, when cutting the extrudate can be one-fourth inch long or less as desired.

In one embodiment, the laser direct structuring process involves three steps: 1) injection molding, 2) laser structuring, and 3) metallizing.

In a further embodiment, during a laser structuring step, a laser is used to form a conductive path during the laser structuring step. In a still further embodiment, the laser used to form a conductive path is laser direct structuring. In a yet further embodiment, laser direct structuring comprises laser etching. In an even further embodiment, laser etching is carried out to provide an activated surface.

In a further embodiment, at least one laser beam draws at least one pattern on the surface of the polymer composition during the laser structuring step. In a still further embodiment, the employed filler composition can release at least one metallic nucleus. In a yet further embodiment, the at least one metallic nucleus that has been released can act as a catalyst for reductive copper plating process.

In a further embodiment, a rough surface can form in the LDS process. In a still further embodiment, the rough surface can entangle the copper plate with the polymer matrix in the polymer composition, which can provide adhesion between the copper plate and the polymer composition. The metalizing step can, in various embodiments, be performed using conventional techniques. For example, in one embodiment, an electroless copper plating bath is used during the metallization step in the LDS process. Thus, in various embodiments, plating a metal layer onto a conductive path is metallization. In a still further embodiment, metallization can comprise the steps: a) cleaning the etched surface; b) additive build-up of tracks; and c) plating.

Definitions

It is also to be understood that the terminology used herein is for the purpose of describing particular embodiments only and is not intended to be limiting. As used in the specification and in the claims, the term "comprising" can include the embodiments "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a polyamide polymer" includes mixtures of two or more polyamide polymers.

As used herein, the term "combination" is inclusive of blends, mixtures, alloys, reaction products, and the like.

Ranges can be expressed herein as from one particular value, and/or to another particular value. When such a range is expressed, another embodiment includes from the one particular value and/or to the other particular value. Similarly, when values are expressed as approximations, by use of the antecedent 'about,' it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the value designated some other value approximately or about the same. It is generally understood, as used herein, that it is the nominal value indicated plus or minus (±) 10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

As used herein the terms "weight percent," "wt %," and "wt. %," which can be used interchangeably, indicate the percent by weight of a given component based on the total weight of the composition, unless otherwise specified. That is, unless otherwise specified, all wt % values are based on the total weight of the composition. It should be understood that the sum of wt % values for all components in a disclosed composition or formulation are equal to 100.

As used herein, the terms "number average molecular weight" or "Mn" can be used interchangeably, and refer to the statistical average molecular weight of all the polymer chains in the sample and is defined by the formula:

$$Mn = \frac{\Sigma N_i M_i}{\Sigma N_i},$$

where $M_i$ is the molecular weight of a chain and $N_i$ is the number of chains of that molecular weight. Mn can be determined for polymers, such as polycarbonate polymers or polycarbonate-poly(methyl methacrylate) ("polycarbonate-PMMA") copolymers, by methods well known to a person having ordinary skill in the art. It is to be understood that as used herein, Mn is measured gel permeation chromatography and as calibrated with polycarbonate standards. For example, gel permeation chromatography can be carried out using a crosslinked styrene-divinyl benzene column, at a sample concentration of 1 milligram per milliliter (mg/ml) with appropriate mobile phase solvents.

As used herein, the terms "weight average molecular weight" or "Mw" can be used interchangeably, and are defined by the formula:

$$Mw = \frac{\Sigma N_i M_i^2}{\Sigma N_i M_1},$$

where Mi is the molecular weight of a chain and Ni is the number of chains of that molecular weight. Compared to Mn, Mw takes into account the molecular weight of a given chain in determining contributions to the molecular weight average. Thus, the greater the molecular weight of a given chain, the more the chain contributes to the Mw. It is to be understood that as used herein, Mw is measured gel permeation chromatography. In some cases, Mw is measured gel permeation chromatography and calibrated with polycarbonate standards. Gel permeation chromatography can be carried out using a crosslinked styrene-divinyl benzene column, at a sample concentration of about 1 milligram per milliliter with appropriate mobile phase solvents.

Certain abbreviations are defined as follows: “g” is grams, “kg” is kilograms, “° C.” is degrees Celsius, “min” is minutes, “mm” is millimeter, “mPa” is megapascal, “WiFi” is a system of accessing the internet from remote machines, “GPS” is Global Positioning System—a global system of U.S. navigational satellites which provide positional and velocity data. “LED” is light-emitting diode, “RF” is radio frequency, and “RFID” is radio frequency identification.

Unless otherwise stated to the contrary herein, all test standards are the most recent standard in effect at the time of filing this application.

Each of the materials disclosed herein are either commercially available and/or the methods for the production thereof are known to those of skill in the art.

It is understood that the compositions disclosed herein have certain functions. Disclosed herein are certain structural requirements for performing the disclosed functions and it is understood that there are a variety of structures that can perform the same function that are related to the disclosed structures, and that these structures will typically achieve the same result.

Embodiment 1

A blended thermoplastic composition comprising: (a) from about 20 wt % to about 80 wt % of a polycarbonate polymer component; (b) from about 5 wt % to about 30 wt % of a polycarbonate-polysiloxane copolymer component; (c) from about 1 wt % to about 20 wt % of a laser direct structuring additive component; and (d) from about 0.02 wt % to about 5 wt % of a metal component; wherein the combined weight percent value of all components does not exceed about 100 wt %; and wherein all weight percent values are based on the total weight of the composition.

Embodiment 2

The composition of Embodiment 1, wherein the blended thermoplastic composition is capable of being plated.

Embodiment 3

The composition of Embodiment 1 or 2, wherein the blended thermoplastic composition has a plating index from about 0.7 to about 2.0 when determined in accordance with ASTM B568.

Embodiment 4

The composition of any of Embodiments 1-3, wherein the polycarbonate polymer component comprises repeating units derived from bisphenol A.

Embodiment 5

The composition of any of Embodiments 1-4, wherein the polycarbonate polymer component has a weight average molecular weight from about 15,000 to about 50,000 grams/mole, as measured by gel permeation chromatography using BPA polycarbonate standards.

Embodiment 6

The composition of any of Embodiments 1-5, wherein the polycarbonate component comprises a first polycarbonate polymer component and a second polycarbonate polymer component.

Embodiment 7

The composition of Embodiment 6, wherein the first polycarbonate polymer component has a melt volume flow rate (MVR) of at least about 20 grams/10 minutes when measured at 300° C. and under a load of 1.2 kg according to ASTM D1238.

Embodiment 8

The composition of Embodiment 6 or 7, wherein the first polycarbonate polymer component has a melt volume flow rate (MVR) of at least about 22 grams/10 minutes when measured at 300° C. and under a load of 1.2 kg according to ASTM D1238.

Embodiment 9

The composition of any of Embodiments 6-8, wherein the first polycarbonate polymer component has a melt volume flow rate (MVR) from about 17 grams/10 minutes to about 32 grams/10 minutes when measured at 300° C. and under a load of 1.2 kg according to ASTM D1238.

Embodiment 10

The composition of any of Embodiments 6-9, wherein the first polycarbonate polymer component has a weight average molecular weight from about 18,000 to about 40,000 grams/mole, as measured by gel permeation chromatography using BPA polycarbonate standards.

Embodiment 11

The composition of any of Embodiments 6-10, wherein the second polycarbonate polymer component has a melt volume flow rate (MVR) of at least about 3.0 grams/10 minutes when measured at 300° C. and under a load of 1.2 kg according to ASTM D1238.

Embodiment 12

The composition of any of Embodiments 6-11, wherein the second polycarbonate polymer component has a melt volume flow rate (MVR) from about 4.0 grams/10 minutes to about 8.0 grams/10 minutes when measured at 300° C. and under a load of 1.2 kg according to ASTM D1238.

Embodiment 13

The composition of any of Embodiments 6-12, wherein the second polycarbonate polymer component has a weight average molecular weight from about 18,000 to about 40,000 grams/mole, as measured by gel permeation chromatography using BPA polycarbonate standards.

Embodiment 14

The composition of any of Embodiments 1-13, wherein the polycarbonate-polysiloxane copolymer component comprises repeating units derived from BPA.

Embodiment 15

The composition of any of Embodiments 1-14, wherein the polycarbonate-polysiloxane copolymer component comprises dimethylsiloxane repeating units.

Embodiment 16

The composition of any of Embodiments 1-15, wherein the laser direct structure additive component comprises a material selected from a metal oxide, a metal oxide-coated filler, spinel crystal, heavy metal mixture oxide spinel, copper salt, or a combinations thereof.

Embodiment 17

The composition of any of Embodiments 1-16, wherein the laser direct structure additive component comprises a material having the formula:

$AB_2O_4$ wherein, A is a metal cation having a valance of 2, such as cadmium, chromium, manganese, nickel, zinc, copper, cobalt, iron, magnesium, tin, titanium, etc., as well as combinations thereof; and wherein B is a metal cation having a valance of 3, such as chromium, iron, aluminum, nickel, manganese, tin, etc., as well as combinations thereof.

Embodiment 18

The composition of any of Embodiments 1-17, wherein the metal component comprises a metal selected from Cu, Fe, Ni, Zn, Ag, Pt, Au, S, Al, Pb, Co, Mn, Mg, Mo, Cr, Ti, Ga, Ge, and Sb, or combinations thereof.

Embodiment 19

The composition of any one of Embodiments 1-18, additionally comprising one or more additives selected from anti-drip agent, antioxidant, antistatic agent, chain extender, colorant, de-molding agent, dye, flow promoter, flow modifier, light stabilizer, lubricant, mold release agent, pigment, quenching agent, thermal stabilizer, UV absorbent substance, UV reflectant substance, and UV stabilizer.

Embodiment 20

An article comprising any of the compositions of Embodiments 1-19.

Embodiment 21

The article of Embodiment 20, wherein the article is molded.

Embodiment 22

The article of Embodiment 20 or 21, wherein the article is extrusion molded.

Embodiment 23

The article of Embodiment 20 or 21, wherein the article is injection molded.

Embodiment 24

The article of any of Embodiments 20-23, wherein the article is selected from a computer device, electromagnetic interference device, printed circuit, Wi-Fi device, Bluetooth device, GPS device, cellular antenna device, smart phone device, automotive device, medical device, sensor device, security device, shielding device, RF antenna device, LED device and RFID device.

Embodiment 25

The article of any of Embodiments 20-24, wherein the article is selected from a computer device, electromagnetic interference device, automotive device, medical device, sensor device, security device, shielding device, RF antenna device, LED device and RFID device.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric. Unless indicated otherwise, percentages referring to composition are in terms of wt %.

There are numerous variations and combinations of reaction conditions, e.g., component concentrations, desired solvents, solvent mixtures, temperatures, pressures and other reaction ranges and conditions that can be used to optimize the product purity and yield obtained from the described process. Only reasonable and routine experimentation will be required to optimize such process conditions.

The materials shown in Table 1 were used to prepare the compositions described and evaluated herein. All samples were prepared by melt extrusion on a Toshiba Twin screw extruder, using different melt temperature and RPM according to different base resin. Tests were all conducted in accordance with ASTM standards, referenced in each test below.

The density was determined in accordance with ISO 1183.

Melt Volume-flow Rate ("MVR") was determined at 300° C. under a load of 1.2 kg and with dwell time of 300 s in accordance with ASTM D1238.

Notched Izod impact strength (NII) was determined at 23° C. on 3.2 millimeter (mm) thick injection molded samples in accordance with ASTM D256.

Tensile testing was carried out at 50 mm/min at 23° C. on standard tensile injection molded bars in accordance with ASTM D638.

Flexural testing was carried out at 1.27 mm/min and 3.2 mm thick injection molded sample in accordance with ASTM D790.

Heat deflection temperature ("HDT") was determined at 1.82 MPa on injection molded samples (3.2 mm×12.5 mm bars) in accordance with ASTM D648. Plating index was determined in accordance with ASTM B568 by testing the copper thickness using X-Ray Fluorescence ("XRF"). Briefly, LDS is carried out on molded plaques with laser power, frequency, and speed varied as indicated. A reference sample for XRF determinations was prepared using Pocan™ DP 7102 with copper plating at about 5 μm. Copper thickness was determined on the reference sample on both sides and at four discrete sample points. The copper thickness values were averaged for the reference sample and the average value is referred to $X_{ref}$. The plating index is defined by the following equation:

$$\text{Plating index} = \frac{\text{Average copper thickness for one parameter field}}{\text{Average copper thickness for reference sample } X_{ref}}$$

TABLE 1

| Component | Chemical Description | Source |
|---|---|---|
| PC1 | BPA polycarbonate resin made by a melt process with an MVR at 300° C./1.2 kg, of about 23.5 to about 28.5 g/10 min; CAS # 111211-39-3. | SABIC Innovative Plastics (I.P.) |
| PC-PS1 | Opaque BPA polycarbonate-polydimethylsiloxane block copolymer comprising about 20 wt % of siloxane (polydimethylsiloxane ("PDMS") residues) and 80 wt % by of BPA; PCP end-capped; with a polydiorganosiloxane chain length of about 40-60 and having a Mw of about 30,000 Daltons; CAS # 202483-49-6. | SABIC I.P. |
| PC-PS2 | Transparent BPA polycarbonate-polydimethylsiloxane ("PDMS") block copolymer comprising about 6 wt % of siloxane (PDMS residues) and 80 wt % by of BPA; para-cumyl phenol ("PCP") end-capped; with a polydiorganosiloxane chain length of about 40-60 and having a Mw of about 23,000 Daltons; CAS # 156064-99-2. | SABIC I.P. |
| M1 | 5 wt % to 10 wt % Silver coated on the surface of copper flake, with a mean particle size of about 40 μM; available under the trade name PAC-4; CAS# 7440-50-8. | Kunming Ligong Hendera Technology Co., Ltd. |
| M2 | 30% concentrate of Silberline 730-15-C in high flow polycarbonate ("HF PC") as masterbatch, with a mean particle size of about 225 μM; available under the trade name Silberline 730-15-C; CAS # 7429-90-5. | Silberline Manufacturing Co., Inc. |
| M3 | 30% concentrate of Silberline 793-20-C in HF PC as masterbatch, with a mean particle size of about 35 μM; available under the trade name Silberline 793-20-C; CAS # 7440-22-4. | Silberline Manufacturing Co., Inc. |
| LDS | Copper chromite black spinel, $CuCr_2O_4$, with a mean particle size of about 1.5 μm; available under the trade name Shepherd Black 1G; CAS # 68186-91-4. | Shepherd Color Company |
| AO1 | Anti-oxidant, tris (2,4-di-tert-butylphenyl)phosphite; available under the trade name Irgafos ™ 168; CAS # 31570-04-4. | BASF |
| AO2 | Sterically hindered phenolic anti-oxidant, pentaerythritol tetrakis(3-(3,5-di-tert-butyl-4-hydroxyphenyl)propionate); available under the trade name Irganox ™ 1010; CAS # 6683-19-8. | BASF |
| MR | Release agent, pentaerythritol tetrastearate (PETS), >90% esterified; CAS # 115-83-3. | Faci Sp. A. |
| UV1 | Ultraviolet ("UV") light stabilizer, 2-(2H-benzotriazol-2-yl)-4-(1,1,3,3-tetramethylbutyl)phenol; available under the trade name TINUVIN ™ 329; CAS #3147-75-9. | BASF |
| Q1 | Quenching agent/stabilizer, zinc phosphate monobasic ($Zn(H_2PO_4)_2$); CAS # 13598-37-3. | Budenheim Fine Chemicals (Shanghai) Co., Ltd. |
| CE1 | Epoxy functional oligomeric acrylic chain extender with Mn ≤3,000, Fn >4, PDI >3 and epoxy equivalent weight EEW = 285 (±15 g/mol) and Tg = 55° C.; available under the trade name Joncryl ™ ADR 4368; CAS # 100-42-5. | BASF |
| T1 | Fine talc with a mean particle size of 1.0-1.1 μM; available under the trade name Luzenac R7; CAS # 14807-96-6, 1318-59-8, 14808-60-7, and 16389-88-1. | Imerys Talc |

TABLE 1-continued

| Component | Chemical Description | Source |
|---|---|---|
| MD1 | Metal deactivator and antioxidant, 2',3-bis [[3-[3,5-di-tert-butyl-4-hydroxyphenyl] propionyl]] propionohydrazide; available under the trade name Irganox ™ MD 1024; CAS # 032687-78-8. | BASF |

The materials used in preparing the samples are listed in Table 1 and were prepared using a Twin screw extruder (Toshiba TEM-37BS, L/D=40.5) with the temperature of the extruder barrel set at 260° C. Pellets extruded from the extruder were then injection molded into 80×10×3 mm bar, cut into 10×10×3 mm square sample for through plane thermal conductivity measurement, Φ100×0.4 mm sheet and cut into Φ25×0.4 mm round sample for in plane thermal conductivity measurement.

Exemplary formulations #1-6 are shown in Table 2, using the materials shown in Table 1. All materials are provided in wt % wherein all weight percent values are based on the total weight of the given formulation. The compounding profile for the preparation of the various formulations shown in Table 2 is given in Table 3, while the molding profile used to prepare molded samples from the formulations is given in Table 4. Molded samples were prepared using these formulations and characterized by various tests described herein above, with the results shown in Table 5.

TABLE 2

| Component | 1 | 2 | 3 | 4 | 5 | 6 |
|---|---|---|---|---|---|---|
| PC1 | 76.9 | 74.9 | 76.8 | 80.8 | 76.6 | 76.6 |
| PC-PS1 | 10 | 10 | 10 | 10 | 10 | 10 |
| PC-PS1 | 5 | 5 | 5 | 5 | 5 | 5 |
| M1 | | | 0.1 | 0.1 | | |
| M2 | | | | | 0.3 | |
| M3 | | | | | | 0.3 |
| LDS | 4 | 6 | 4 | | 4 | 4 |
| AO1 | 0.06 | 0.06 | 0.06 | 0.06 | 0.06 | 0.06 |
| AO2 | 0.1 | 0.1 | 0.1 | 0.1 | 0.1 | 0.1 |
| MR | 0.3 | 0.3 | 0.3 | 0.3 | 0.3 | 0.3 |
| UV1 | 0.12 | 0.12 | 0.12 | 0.12 | 0.12 | 0.12 |
| Q1 | 0.2 | 0.2 | 0.2 | 0.2 | 0.2 | 0.2 |
| CE1 | 0.2 | 0.2 | 0.2 | 0.2 | 0.2 | 0.2 |
| T1 | 3 | 3 | 3 | 3 | 3 | 3 |
| MD1 | 0.12 | 0.12 | 0.12 | 0.12 | 0.12 | 0.12 |
| Total | 100 | 100 | 100 | 100 | 100 | 100 |

TABLE 3

| Parameters | Unit | Value |
|---|---|---|
| Compounder Type | None | Toshiba TEM-37BS |
| Barrel Size | mm | 1500 |
| Die | mm | 3 |
| Zone 1 Temp | ° C. | 250 |
| Zone 2 Temp | ° C. | 250 |
| Zone 3 Temp | ° C. | 250 |
| Zone 4 Temp | ° C. | 250 |
| Zone 5 Temp | ° C. | 260 |
| Zone 6 Temp | ° C. | 260 |
| Zone 7 Temp | ° C. | 260 |
| Zone 8 Temp | ° C. | 260 |
| Zone 9 Temp | ° C. | 260 |
| Zone 10 Temp | ° C. | 260 |
| Zone 11 Temp | ° C. | 260 |
| Zone 12 Temp | ° C. | 260 |
| Die Temp | ° C. | 260 |
| Screw speed | *rpm | 300 |

TABLE 3-continued

| Parameters | Unit | Value |
|---|---|---|
| Throughput | **kg/hr | 25 |
| Vacuum 1 | MPa | −0.08 |

*kilograms per hour;
**rotations per minute (rpm)

TABLE 4

| Parameter | Unit | Value |
|---|---|---|
| Pre-drying time | Hour | 3 |
| Pre-drying temp | ° C. | 100 |
| Hopper temp | ° C. | 70 |
| Zone 1 temp | ° C. | 270 |
| Zone 2 temp | ° C. | 280 |
| Zone 3 temp | ° C. | 285 |
| Nozzle temp | ° C. | 285 |
| Mold temp | ° C. | 80 |
| Screw speed | rpm | 80 |
| Back pressure | *kgf/cm$^2$ | 30 |
| Cooling time | s | 20 |
| Injection speed | **mm/s | 100 |
| Holding pressure | kgf/cm$^2$ | 800 |
| Max. injection pressure | kgf/cm$^2$ | 1200 |

*kilogram force per square centimeter (kgf/cm$^2$);
**millimeters per second (mm/s)

The effect of LDS additives and different kinds of metal fillers on the mechanical properties and plating performance of PCP 1300 base resin is shown in Table 5. The performance comparison of different kinds of metal fillers including copper powder, aluminum flake, and silver powder with/without a LDS additive in PCP 1300 composites is given in Table 5. Formulations #1 and #2 contain 4 wt % and 6 wt % of LDS additives, respectively. While both formulations #3 and #4 contain 0.1 wt % copper powder, only formulation #3 contains a LDS additive. Formulation #5 contains 0.3 wt % aluminum flake, and formulation #6 contains 0.3 wt % silver powder. As can be seen, all the samples with metal filler and 4 wt % LDS additive (Formulations #3, #5 and #6) have similar flexural modulus, tensile stress, and HDT values when compared to samples without metal filler (Formulations #1 and #2). The notched Izod impact strength (NII) was only slightly decreased for formulations containing both metal filler and LDS additive.

The plating performance of representative formulations is given in FIG. 1, with the number below the sample corresponding to the formulation number in Table 2. The data show that with the addition of 4 wt % LDS additive, the plating index was 0.62. This was only improved to 0.75 at 6 wt % level of LDS additive. In contrast, a formulation with only 0.1 wt % Cu powder, it was observed that no plating after laser etching could be realized. Surprisingly, a combination of 4 wt % LDS additive and 0.1 wt % Cu powder the plating index is significantly improved to 0.84. These data suggest that Cu powder was able to act synergistically with LDS materials to provide higher laser activation and plating efficiency. Similarly, this synergistic effect is also observed with formulations comprising a combination of LDS additive and other metal additives, e.g. Al or Ag powders.

TABLE 5

| Test Description | Unit | #1 | #2 | #3 | #4 | #5 | #6 |
|---|---|---|---|---|---|---|---|
| Ash | % | 7.15 | 8.245 | 7.225 | 3.44 | 6.91 | 6.865 |
| MVR, 300° C., 1.2 Kg, 360 s | $cm^3$/10 min | 19.6 | 20.4 | 23.4 | 16.4 | 12.6 | 12.9 |
| MVR, 300° C., 1.2 Kg, 1080 s | $cm^3$/10 min | 36.5 | 38.3 | 47 | 22.5 | 22.8 | 22.2 |
| Density | *$g/cm^3$ | 1.2426 | 1.2564 | 1.2440 | 1.2094 | 1.2433 | 1.2439 |
| Notched Impact Strength, 23° C. | J/m | 717 | 680 | 593 | 815 | 571 | 543 |
| HDT, 1.82 MPa, 3.2 mm | ° C. | 122 | 123 | 122 | 123 | 124 | 124 |
| Flexural Modulus | MPa | 2250 | 2200 | 2260 | 2220 | 2430 | 2440 |
| Flexural Stress @ Yield | MPa | 90 | 89.4 | 89.9 | 89.7 | 89.4 | 89.8 |
| Modulus of Elasticity | MPa | 2520 | 2469 | 2540 | 2493 | 2434 | 2454 |
| Stress at Yield | MPa | 58.3 | 58.2 | 58.5 | 59 | 58 | 58 |
| Stress at Break | MPa | 48.8 | 48.7 | 49.5 | 48.6 | 42.9 | 45.4 |
| Elongation at Yield | % | 5.4 | 5.5 | 5.3 | 5.5 | 5.49 | 5.49 |
| Elongation at Break | % | 62 | 52.5 | 64.3 | 55.7 | 8.39 | 20.34 |

*grams per cubic centimeter ($g/cm^3$)

The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A blended thermoplastic composition comprising:

a. from about 55.5 wt % to about 80 wt % of a polycarbonate polymer component, wherein the polycarbonate polymer component comprises repeating units derived from bisphenol A;

b. from about 5 wt % to about 30 wt % of a polycarbonate-polysiloxane copolymer component;

c. from about 1 wt % to about 12.5 wt % of a laser direct structuring additive component, wherein the laser direct structuring additive component comprises copper hydroxide phosphate, copper phosphate, copper chromium oxide spinel, or a combination thereof; and d. from about 0.02 wt % to about 2 wt % of a metal, wherein the metal is selected from Cu, or a combination thereof;

wherein the combined weight percent value of all components does not exceed about 100 wt %, and wherein all weight percent values are based on a total weight of the composition.

2. The blended thermoplastic composition of claim 1, wherein the blended thermoplastic composition is capable of being plated.

3. The blended thermoplastic composition of claim 1, wherein the blended thermoplastic composition has a plating index from about 0.7 to about 2.0 when determined in accordance with ASTM B568.

4. The blended thermoplastic composition of claim 1, wherein the polycarbonate polymer component has a weight average molecular weight from about 15,000 to about 50,000 grams/mole, as measured by gel permeation chromatography using BPA polycarbonate standards.

5. The blended thermoplastic composition of claim 1, wherein the polycarbonate component comprises a first polycarbonate polymer component and a second polycarbonate polymer component.

6. The blended thermoplastic composition of claim 5, wherein the first polycarbonate polymer component has a melt volume flow rate (MVR) of at least about 20 grams/10 minutes when measured at 300° C. and under a load of 1.2 kg according to ASTM D1238.

7. The blended thermoplastic composition of claim 5, wherein the first polycarbonate polymer component has a melt volume flow rate (MVR) of at least about 22 grams/10 minutes when measured at 300° C. and under a load of 1.2 kg according to ASTM D1238.

8. The blended thermoplastic composition of claim 5, wherein the first polycarbonate polymer component has a melt volume flow rate (MVR) from about 17 grams/10 minutes to about 32 grams/10 minutes when measured at 300° C. and under a load of 1.2 kg according to ASTM D1238.

9. The blended thermoplastic composition of claim 5, wherein the first polycarbonate polymer component has a weight average molecular weight from about 18,000 to about 40,000 grams/mole, as measured by gel permeation chromatography using BPA polycarbonate standards.

10. The blended thermoplastic composition of claim 5, wherein the second polycarbonate polymer component has a melt volume flow rate (MVR) of at least about 3.0 grams/10 minutes when measured at 300° C. and under a load of 1.2 kg according to ASTM D1238.

11. The blended thermoplastic composition of claim 5, wherein the second polycarbonate polymer component has a melt volume flow rate (MVR) from about 4.0 grams/10 minutes to about 8.0 grams/10 minutes when measured at 300° C. and under a load of 1.2 kg according to ASTM D1238.

12. The blended thermoplastic composition of claim 5, wherein the second polycarbonate polymer component has a weight average molecular weight from about 18,000 to about 40,000 grams/mole, as measured by gel permeation chromatography using BPA polycarbonate standards.

13. The blended thermoplastic composition of claim 1, wherein the polycarbonate-polysiloxane copolymer component comprises repeating units derived from BPA.

14. The blended thermoplastic composition of claim 1, wherein the polycarbonate-polysiloxane copolymer component comprises dimethylsiloxane repeating units.

15. The blended thermoplastic composition of claim 1, additionally comprising one or more additives selected from anti-drip agent, antioxidant, antistatic agent, chain extender, colorant, de-molding agent, dye, flow promoter, flow modifier, light stabilizer, lubricant, mold release agent, pigment, quenching agent, thermal stabilizer, UV absorbent substance, UV reflectant substance, and UV stabilizer.

16. An article comprising any of the compositions of claim 1.

17. The blended thermoplastic composition of claim 1, wherein a molded article comprising the blended thermoplastic composition has a plating index of about 0.7 to about 2.0.

18. The blended thermoplastic composition of claim 1, wherein the blended thermoplastic composition comprises about 0.1 wt % to about 1 wt % of the metal.

* * * * *